(12) United States Patent
Wu et al.

(10) Patent No.: US 6,552,372 B2
(45) Date of Patent: Apr. 22, 2003

(54) INTEGRATED CIRCUIT HAVING IMPROVED ESD PROTECTION

(75) Inventors: Yi-Hsun Wu, Hsin-Chu (TW);
Jian-Hsing Lee, Hsin-Chu (TW);
Shui-Hung Chen, Hsin-Chu (TW);
Jian-Ren Shih, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 09/827,194

(22) Filed: Apr. 5, 2001

(65) Prior Publication Data
US 2002/0149029 A1 Oct. 17, 2002

(51) Int. Cl.$^7$ ................................................ H01L 29/72
(52) U.S. Cl. ..................... 257/173; 257/360; 257/202; 257/206; 257/203; 257/204; 257/355; 257/356; 257/357
(58) Field of Search ................................ 257/173, 360, 257/202, 206, 203, 204, 355, 356, 357; 361/111, 56, 212, 117, 119

(56) References Cited

U.S. PATENT DOCUMENTS

| | | | | |
|---|---|---|---|---|
| 5,440,163 A | * | 8/1995 | Ohhashi | 257/355 |
| 5,739,571 A | * | 4/1998 | Kurachi | 257/355 |
| 5,760,428 A | * | 6/1998 | Colwell et al. | 257/202 |
| 6,323,689 B1 | * | 11/2001 | Morishita | 257/355 |

* cited by examiner

Primary Examiner—Richard Elms
Assistant Examiner—Douglas M Menz
(74) Attorney, Agent, or Firm—Tung & Associates

(57) ABSTRACT

An MOS integrated circuit, such as an input-output buffer, exhibits improved resistance to damage from electrostatic discharge (ESD) by balancing the ESD current flow through active and inactive sections of drivers. Better balance of the ESD current flow is achieved by increasing the width and length of nulti-finger channels of semiconductor material defining the gates of the drivers in the active section. Wider, longer gates of the drivers in the active section increase their ability to carry current, thereby resulting in a more symmetrical distribution of ESD current between the active and inactive sections without degrading the IC's normal performance.

12 Claims, 2 Drawing Sheets

INTEGRATED CIRCUIT HAVING IMPROVED ESD PROTECTION

FIELD OF THE INVENTION

The present invention broadly relates to integrated circuits, especially MOS buffer drivers, and deals more particularly with an improved circuit structure for protecting the buffer driver from electrostatic discharge (ESD).

BACKGROUND OF THE INVENTION

Integrated circuits (ICs) may be damaged by electrostatic discharge (ESD) phenomena produced by any of a number of sources. One major source of ESD exposure to ICs is from the human body. A charge can be induced on a body capacitance of 150 pF, leading to electrostatic potentials of 4 kV or greater. Contact with a charged human body by an uncharged or grounded IC pin can result in a discharge for about 100 ns with the currents of several amperes. Similar levels of ESD may be imposed on IC's from other sources such as from metallic objects and the so-called charged device model (CDM) wherein the IC itself is charged and discharged to ground.

As the density of very large scale integrated circuits (VLSI) circuit increases, the components of the circuits are becoming progressively smaller, and more susceptible to damage from ESD. For example, the gate oxides of MOS transistors are becoming thinner and thinner, thus making the gate oxide layer more susceptible to destruction caused by ESD. It is especially important to protect gate oxide at input buffers and to MOS components at bi-directional buffers and output drivers. In some cases, it is possible to use on-chip protection circuits dedicated to protecting internal IC circuitry from the effects of ESD, however, these special protection circuits add to the cost of the IC and may not completely eliminate the problem in many applications.

A unique problem of ESD protection is presented by I/O drivers having multiple stages of driver circuits that are selectable to achieve a particular I/O current level. In those cases wherein less than all of the total number of available stages is actually connected to achieve an output drive current, the remaining, unconnected stages are unused and are sometimes referred to as "dummy" output stages. Where an I/O driver possesses both active and dummy stages, an unbalanced or unsymmetric load situation arises when the I/O buffer is subjected to ESD. The active stages are connected to ground and thus have gate oxide layers that break down at a slower speed but at a higher voltage. Conversely the dummy stages are not connected to ground and their gate oxides breakdown more quickly but at lower voltage levels. As a result, an ESD current flowing through the IC is not evenly divided between the active and dummy stages. Consequently, the maximum ESD tolerance of the IC is determined by the most susceptible section, i.e. the active stages which have a lower breakdown voltage.

The task of designing IC's to maximize their tolerance to ESD is complicated by the fact that design modifications to make the circuit more tolerant of ESD cannot be at the sacrifice of circuit performance. Thus, IC's must be designed to tolerate industry standard levels of ESD, e.g. 2 kV without any reductions in specified levels of I/O driver currents.

The present invention overcomes the deficiencies of the prior art discussed above and satisfies the need for an improved ESD tolerant IC.

SUMMARY OF THE INVENTION

The present invention provides a novel structure for an MOS integrated circuit that improves the IC's ability to resist damage caused by electrostatic discharge (ESD), where the IC employs both active and inactive sections of drivers.

In accordance with the present invention, an MOS integrated circuit includes first and second sections of MOS drivers, wherein the first section is connected to drive an output load at a desired level of current, and the second section comprises inactive, unused drivers. The drivers in both sections are defined by a plurality of multi-fingered channels of semiconductor forming the gates of the drivers. Because the gates of the unused section of the drivers are not connected to the output load, the amount of ESD current flowing through the unused drivers is greater than that flowing through the active drivers used to drive the load. In accordance with the present invention, the width and length of the channels forming the drivers in the first, active section are greater than those of the channels in the second, unused section in order to increase the ability of the drivers in the first section to carry the flow of current therethrough produced by an ESD.

In a preferred embodiment of the invention, the width and length of the channels defining the drivers in the first, active section are approximately twice the length and width of the channels forming the drivers in the second, unused section. In one embodiment, the total width of the channels defining the drivers in both the first and second sections is approximately 300 microns.

Accordingly, it is the primary object of the invention to provide an MOS integrated circuit having improved tolerance of electrostatic discharge, without damage.

Another object of the present invention is to provide an MOS integrated circuit as mentioned above which achieves higher resistance to ESD, without degrading normal circuit performance.

A still further object to the invention is to provide an input/output buffer with active and inactive sections that exhibits improved resistance to ESD without the need for special protective circuitry.

These, and further objects and advantages will be made clear or will become apparent during the course of the following description of a preferred embodiment of the invention.

BRIEF DESCRIPTION OF THE DRAWINGS

In the drawings, which form an integral part of the specification, and are to be read in conjunction therewith, and in which like components are used to designate identical components in the various views.

DETAILED DESCRIPTION OF THE PREFERRED EMBODIMENT

Figure 1:
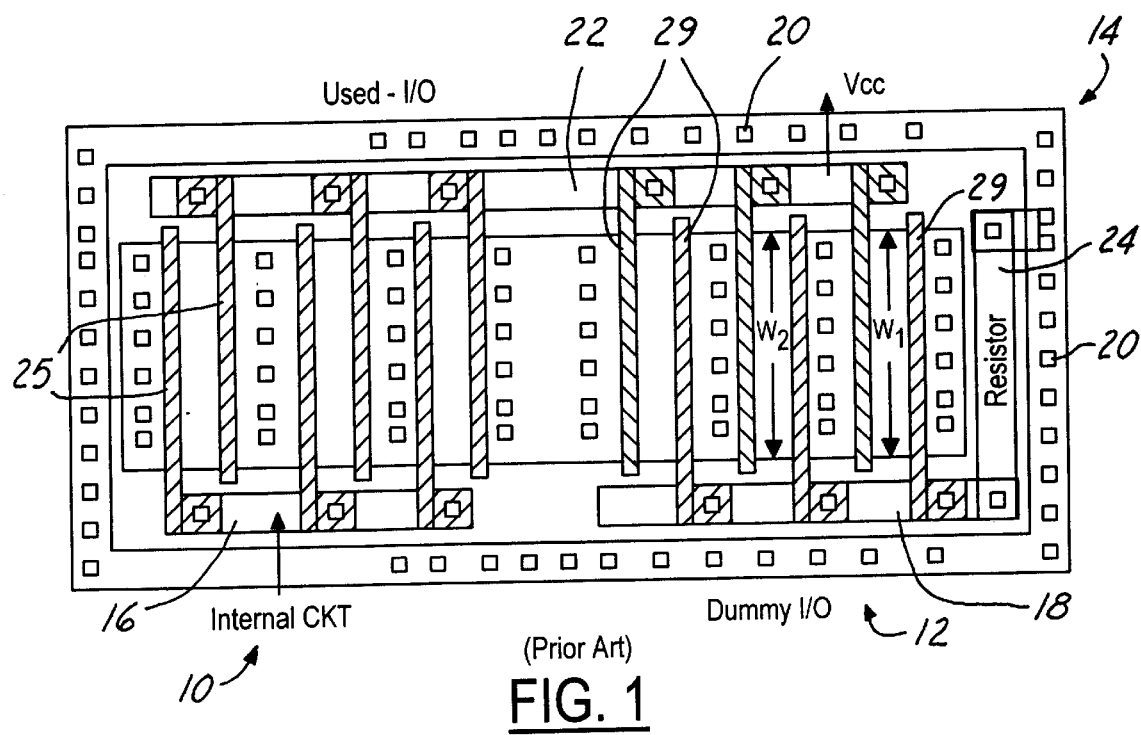
FIG. 1 is plan view of a typical prior art integrated circuit having active and dummy driver sections.

FIG. 1 depicts a typical MOS type integrated circuit chip 14 that functions as an input/output buffer to drive a load (not shown). In order that the IC 14 can be used for a variety of applications requiring different levels of driver current, the driver sections of the IC are selectively connected at the time of manufacture to meet the driver current requirements of a given application. Consequently, the IC includes a first, active section 10 of drivers, and a second, inactive or dummy section 12 of MOS drivers whose gates are not connected to receive control signals. In the present illustrated embodiment, the drivers in each of sections 10 and 12 are defined by an array of multi-finger channels of semiconductor material, each of the channels having a width measured between the source and the drain, and a transversely extending length. As shown in FIG. 1, the gate channels of the active and inactive sections 10, 12 are designated by the numerals 25 and 29 respectively. The width of the gate channels 29, for example, are designated as channels W1, W2 . . . . One group of the gates of drivers in the active section 10 are coupled via common pad 16 to a voltage source Vss. Likewise, one group of the gates forming the drivers of the dummy section 12 are connected by a common pad 18 to a voltage source Vss. The remaining gates of both the used and unused sections 10, 12 are connected by a common pad 22 to a second voltage source Vcc. The gate channels connected by the pad 18 are each connected through a resistor 24 to pads on a lead frame 20. As a result of the use of the resistor 24, the gate voltage present on pads 18 is normally zero. Consequently a breakdown voltage of the drivers of the dummy section 12 is higher than that of the corresponding drivers of the active section 10. Since the breakdown voltage of the drivers in the dummy section 12 is higher, breakdown occurs more slowly compared to the drivers in the active section 10 whose gate voltages are greater than zero. As result, in the event of an ESD, the flow of current through the drivers of the active section 10 is greater than the level of current flowing through the drivers in the dummy section 12. This results in a form of unsymmetrical current flow in which the ability of the IC 14 to withstand an ESD without damage is determined primarily by the current carrying ability of the drivers in the active section 10.

Figure 2:
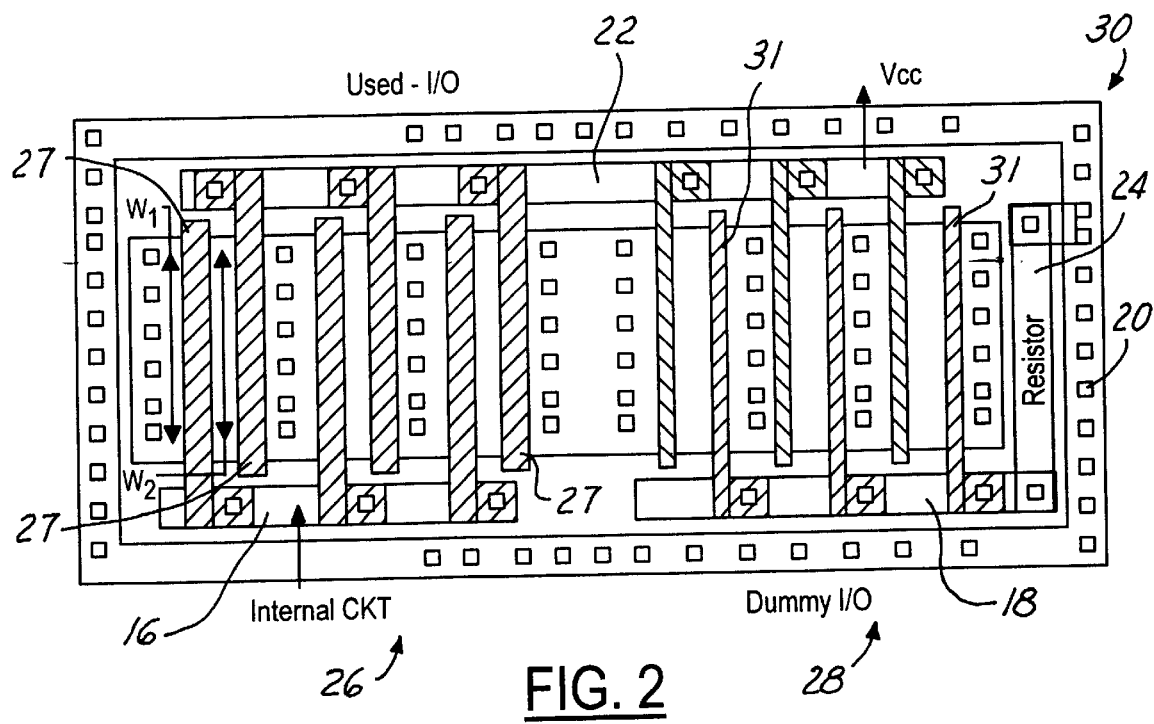
FIG. 2 is a view similar to FIG. 1 but depicting the novel integrated circuit of the present invention.
Figure 3:
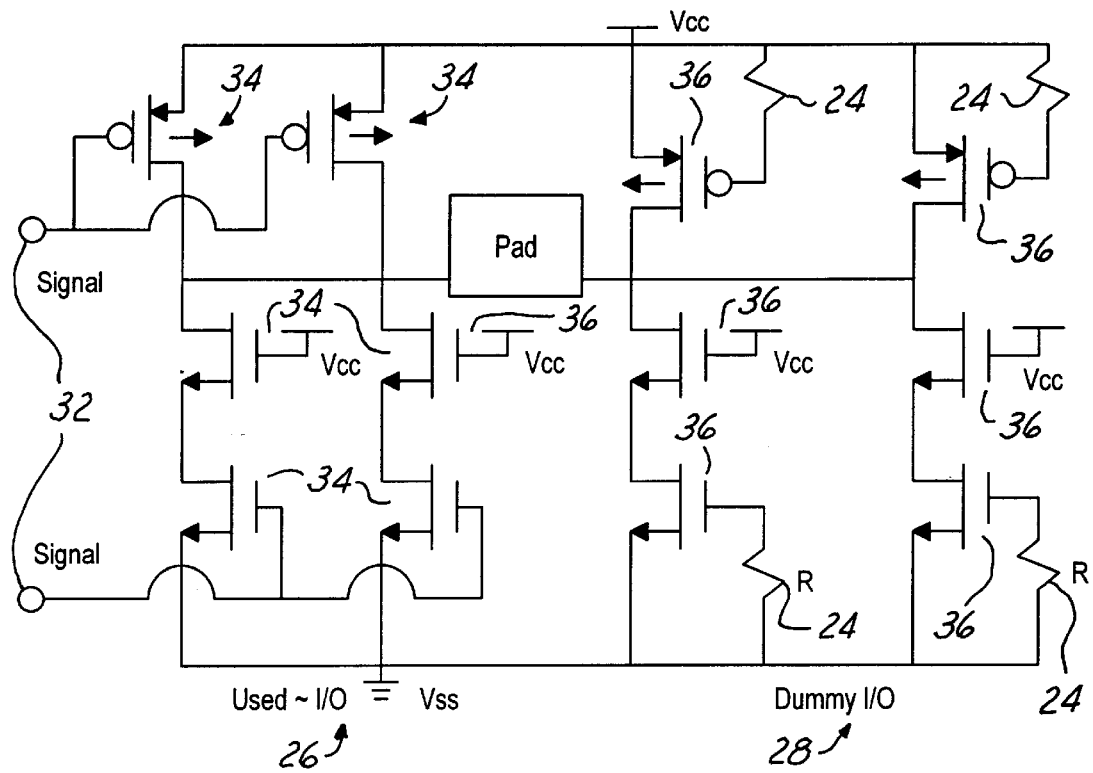
FIG. 3 is a detailed schematic diagram of the circuit corresponding to the integrated circuit shown in FIG. 2; and, FIG. 4 is a cross sectional view taken through the integrated circuit shown in FIG. 2.
Figure 4:
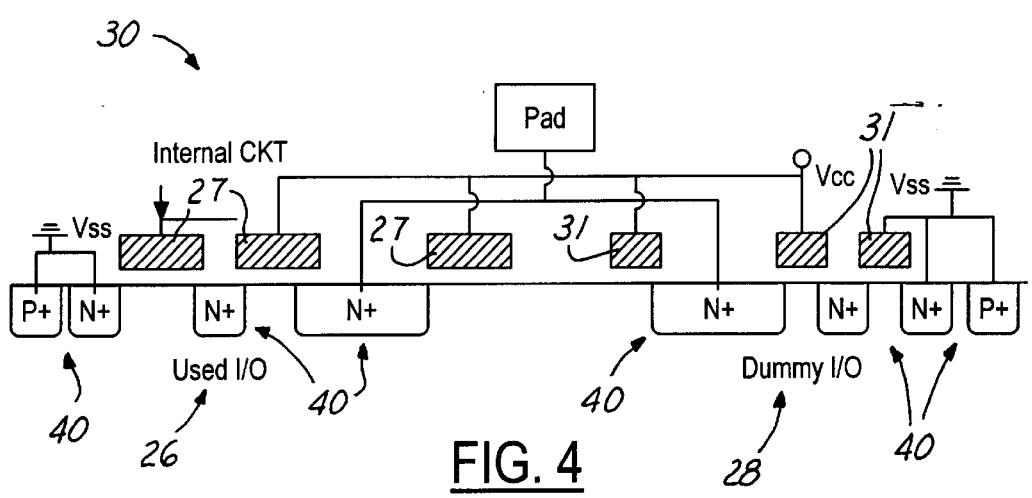

Referring now to also FIGS. 2, 3 and 4, it had been found that the tolerance of an MOS IC to ESD current without damage can be substantially increased by increasing the current carrying ability of the drivers in the unused section of the IC. Accordingly, an MOS IC 30 includes active and inactive sections, 26, 28 respectively of N type MOS drivers, which, like the configuration shown in FIG. 1, each comprise a plurality of channels 40 of semiconductor material, herein shown as being formed of N+ and P+ type semiconductor materials.

Unlike the IC 14 shown in FIG. 1, however, the width and length of the gate channels 27 of the drivers in the active section 26 are greater than the corresponding width and length of the channels defining the drivers in the inactive or dummy section 28. For ease of illustration, it should be noted that the increase in the width of the channels 27 is not specifically shown in FIG. 2, however it is to be understood that in practice, these channels will be formed with a width that is greater than the width of the channels 31 in the inactive section 28.

In one example where the IC chip 30 has a width of 35 microns and a length of 45 microns it has been found that the IC 30 will exhibit good resistance to ESD up to 2 KV where the sum of the widths of all the channels of the active and inactive sections 26, 28 total about 300 microns. In order to achieve substantially balanced flow of ESD current through the active and inactive sections 26, 28 it has been found that it is preferable to increase the width and length of channels 27 to approximately twice the corresponding width and length of the channels 31 in the dummy section 28.

From the foregoing, it is apparent that the improved MOS IC described above not only provides for the reliable accomplishment of the objects of the invention, but does so in a particularly economical and efficient manner. It is recognized, of course, that those skilled in the art may make various modifications or additions chosen to illustrate the invention without departing from the spirit and scope of the present contribution to the art. Accordingly, it is to be understood that the protections sought and to be afforded hereby should be deemed to extend to the subject matter claimed and all equivalents thereof fairly within the scope of the invention.

What is claimed is:

1. An MOS integrated circuit having improved resistance to electrostatic discharge (ESD) damage, comprising:

a first active section of MOS devices connected between an output pad of the IC and a source of voltage; and, a second, inactive dummy section of MOS devices connected between said pad and said voltage source, the devices in each of said active and dummy sections being defined by a multi-finger array of channels of semiconductor material, each of said channels having a width from the source to the drain of the device, and having a length, the width of the channels forming the devices in said first active section being wider than the channels forming the devices in said second dummy section, whereby the current carrying capacity of said first active section is increased, thereby to better balance the flow of current through said first and second sections resulting from an ESD.

2. The integrated circuit of claim 1, wherein the length of the channels in said first active section is greater than the length of the channels in said second dummy section.

3. The integrated circuit of claim 1, wherein each of said channels defines a gate of the corresponding device.

4. The integrated circuit of claim 2, wherein each of said channels defines a gate of the corresponding device.

5. The integrated circuit of claim 2, wherein the total combined width of the channels of the first and second sections is approximately 300 microns.

6. The integrated circuit of claim 1, wherein the width of the channels in said first section is approximately twice the width of the channels in said second section.

7. The integrated circuit of claim 2, wherein the width of the channels in said first section is approximately twice the width of the channels in said second section, and the length of the channels in said first section is approximately twice the length of the channels in said second section.

8. An MOS integrated circuit having improved resistance to electrostatic discharge (ESD) damage, comprising:

a first active section of MOS drivers;

a second, inactive dummy section of MOS drivers, and, the drivers in each of said first and second sections including a multi-finger array of channels of semiconductor material respectively defining the gates of said drivers in said sections, each of said channels having a width from the source to the drain of the device, and having a length, the width and length of the channels defining the gates of the drivers in said first section being greater than the corresponding width and length of the channels forming the drivers in said second section, whereby the current carrying capacity of said first section is increased, thereby to better balance the flow of current through said first and second sections resulting from an ESD.

9. The integrated circuit of claim 8, wherein the total combined width of the channels of the first and second sections is approximately 300 microns.

10. The integrated circuit of claim 8, wherein the width of the channels in said first section is approximately twice the width of the channels in said second section.

11. The integrated circuit of claim 8, wherein the width of the channels in said first section is approximately twice the width of the channels in said second section, and the length of the channels in said first section is approximately twice the length of the channels in said second section.

12. The integrated circuit of claim 8, wherein the length of the channels in said first section is approximately twice the length of the channels in said second section.

* * * * *

UNITED STATES PATENT AND TRADEMARK OFFICE
CERTIFICATE OF CORRECTION

| | |
|---|---|
| PATENT NO. | : 6,552,372 B2 |
| APPLICATION NO. | : 09/827194 |
| DATED | : April 22, 2003 |
| INVENTOR(S) | : Wu et al. |

It is certified that error appears in the above-identified patent and that said Letters Patent is hereby corrected as shown below:

In Col. 4, line 23, delete "width" and insert --length--.
In Col. 4, line 24, delete "length" and insert --width--.
In Col. 4, line 57, delete "width" and insert --length--.
In Col. 4, line 58, delete "length" and insert --width--.

Signed and Sealed this
Third Day of July, 2012

David J. Kappos
*Director of the United States Patent and Trademark Office*